United States Patent
Chen

(10) Patent No.: US 7,696,068 B2
(45) Date of Patent: Apr. 13, 2010

(54) METHOD FOR MANUFACTURING VERTICAL LIGHT-EMITTING DIODE

(75) Inventor: Shi-Ming Chen, Tainan (TW)

(73) Assignee: Epistar Corporation, Hsinchu (TW)

( * ) Notice: Subject to any disclaimer, the term of this patent is extended or adjusted under 35 U.S.C. 154(b) by 113 days.

(21) Appl. No.: 11/971,861

(22) Filed: Jan. 9, 2008

(65) Prior Publication Data

US 2008/0108161 A1    May 8, 2008

Related U.S. Application Data

(62) Division of application No. 11/264,774, filed on Oct. 31, 2005, now abandoned.

(30) Foreign Application Priority Data

Sep. 15, 2005  (TW) ............................... 94131924 A

(51) Int. Cl.
   *H01L 21/00* (2006.01)
(52) U.S. Cl. ............... 438/463; 438/460; 257/E21.599; 257/E21.219
(58) Field of Classification Search .................. 438/460, 438/462, 463, 464, 765; 257/E21.599, E21.219, 257/E21.221
See application file for complete search history.

(56) References Cited

U.S. PATENT DOCUMENTS 5,187,547 A    2/1993  Niina

2004/0140534 A1*  7/2004  Yoshihara et al. ........... 257/632
2005/0208691 A1*  9/2005  Shei et al. ..................... 438/29

FOREIGN PATENT DOCUMENTS

| CN | 1407637 A | 4/2003 |
|---|---|---|
| CN | 1447448 A | 10/2003 |
| CN | 2005101173441 | 10/2007 |
| CN | 2005101173441 | 3/2008 |

* cited by examiner

*Primary Examiner*—Walter L Lindsay, Jr.
(74) *Attorney, Agent, or Firm*—Winston Hsu

(57) ABSTRACT

A method for manufacturing a vertical light-emitting diode is described. In the method for manufacturing the vertical light-emitting diode, a sapphire substrate is provided. An illuminant epitaxial structure is formed on the sapphire substrate. Next, a first conductivity type electrode is formed on a surface of the illuminant epitaxial structure. Then, a local removal step is performed to remove a portion of the sapphire substrate from another surface of the illuminant epitaxial structure and to expose a portion of the other surface of the illuminant epitaxial structure, wherein the other surface is opposite to the surface of the illuminant epitaxial structure. Subsequently, a second conductivity type electrode is formed on the exposed portion of the other surface of the illuminant epitaxial structure, wherein the first conductivity type electrode and the second conductivity type electrode are opposite conductivity types.

17 Claims, 5 Drawing Sheets

METHOD FOR MANUFACTURING VERTICAL LIGHT-EMITTING DIODE

RELATED APPLICATIONS

The present application is a divisional application of U.S. patent application Ser. No. 11/264,774, filed Oct. 31, 2005, which claims the priority benefit of Taiwan Application Serial Number 94131924, filed Sep. 15, 2005, the disclosure of which is hereby incorporated by reference herein in its entirety.

FIELD OF THE INVENTION

The present invention relates to a method for manufacturing a light-emitting diode, and more particularly, to a method for manufacturing a vertical light-emitting diode with a local removal substrate.

BACKGROUND OF THE INVENTION

FIGS. 1a through 1d are schematic flow diagrams showing the process for manufacturing a conventional vertical light-emitting diode. A sapphire substrate 100 is first provided. Next, an illuminant epitaxial structure 102 is formed on a surface of the sapphire substrate 100 by an epitaxial method, such as shown in FIG. 1a. Typically, the illuminant epitaxial structure 102 is mainly composed of a first conductivity type semiconductor layer, an active layer and a second conductivity type semiconductor layer. Because the sapphire substrate 100 is made of an electrically insulating material, another conductive substrate 104 usually has to be provided and the electrically insulating sapphire substrate 100 is removed when a vertical connecting electrode structure is fabricated. After the illuminant epitaxial structure 102 is completed, the illuminant epitaxial structure 102 is adhered to the conductive substrate 104 by a bonding method, such as shown in FIG. 1b.

After the illuminant epitaxial structure 102 is bonded to the substrate 104, the whole sapphire substrate 100 is removed from the illuminant epitaxial structure 102 by a laser ablation technique, so as to expose a surface of the illuminant epitaxial structure 102, such as shown in FIG. 1c. Then, a first conductivity type electrode 106 and a second conductivity type electrode 108 are respectively formed on the illuminant epitaxial structure 102 and the substrate 104. Subsequently, a dicing step is performed to form a plurality of light-emitting diode chips 110, such as shown in FIG. 1d.

However, in the aforementioned process of the light-emitting diode, when the laser ablation technique is used to remove the sapphire substrate 100, a stress, which is caused by the high temperature or large temperature difference during the laser treating process, damages the structure of the light-emitting diode. Moreover, the device quality is degraded by the excessively large energy transfer induced in the ablation process. Therefore, the operation quality and the product yield of the light-emitting diode are decreased. In addition, the ablation rate of the substrate is very slow, so it takes a long time to ablate the whole substrate, which increases the process cost and reduces the throughput. Besides, this process requires bonding the illuminant epitaxial structure to the additional substrate 104, further increasing cost and lowering yield.

SUMMARY OF THE INVENTION

Therefore, one objective of the present invention is to provide a method for manufacturing a vertical light-emitting diode by removing a portion of a sapphire substrate after the growth of an epitaxial structure, which can resolve the light-absorbing problem of the substrate. In addition, the light can be extracted from the sapphire substrate, thereby enhancing the light extraction efficiency.

Another objective of the present invention is to provide a method for manufacturing a vertical light-emitting diode, which only removes a portion of a sapphire substrate and does not need an additional process of bonding an illuminant structure to another substrate, thereby enhancing the process yield and effectively reducing the production cost.

According to the aforementioned objectives, the present invention provides a method for manufacturing a vertical light-emitting diode comprising the following steps. A sapphire substrate is provided. An illuminant epitaxial structure is formed on the sapphire substrate. Next, a first conductivity type electrode is formed on a surface of the illuminant epitaxial structure. Then, a local removal step is performed to remove a portion of the sapphire substrate from another surface of the illuminant epitaxial structure and to expose a portion of the other surface of the illuminant epitaxial structure, wherein the other surface is opposite to the surface of the illuminant epitaxial structure and is where the first conductivity type electrode is located. Subsequently, a second conductivity type electrode is formed on the exposed portion of the other surface of the illuminant epitaxial structure, wherein the first conductivity type electrode and the second conductivity type electrode are opposite conductivity types.

According to a preferred embodiment of the present invention, the local removal step is performed by a laser dicing technique and a laser ablation technique, and a material of the first conductivity type electrode is a high-reflectivity metal.

By using a laser ablation technique to locally remove the sapphire substrate, the light-absorbing problem of the substrate can be resolved, and the light can be extracted from the sapphire substrate, so that the light extraction effect can be increased. Besides, bonding an additional substrate is not needed, thereby reducing cost and increasing the process yield. Furthermore, because only a portion of the sapphire substrate is ablated, the structure of the light-emitting diode is not damaged by high temperature, which can ensure the operation reliability of the device, enhance the production yield and decrease the cost.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

The present invention discloses a method for manufacturing a vertical light-emitting diode by removing a portion of a sapphire substrate after an illuminant epitaxial structure is formed, which can enhance the process yield, reduce the process cost, increase the light extraction effect and enhance the operation reliability of the device. In order to make the illustration of the present invention more explicit and complete, the following description is stated with reference to FIGS. 2a through 2e.

Figure 1A:
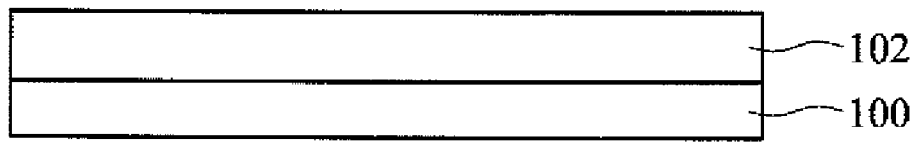
FIGS. 1a through 1d are schematic flow diagrams showing the process for manufacturing a conventional vertical light-emitting diode.
Figure 1B:
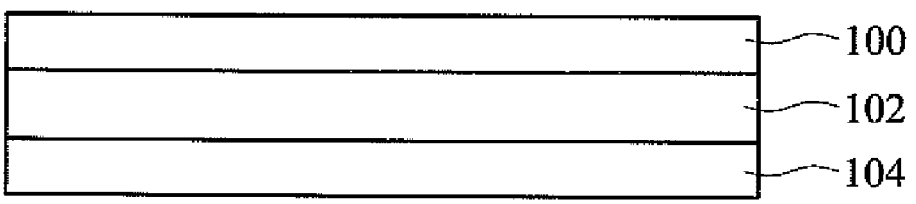
Figure 1C:
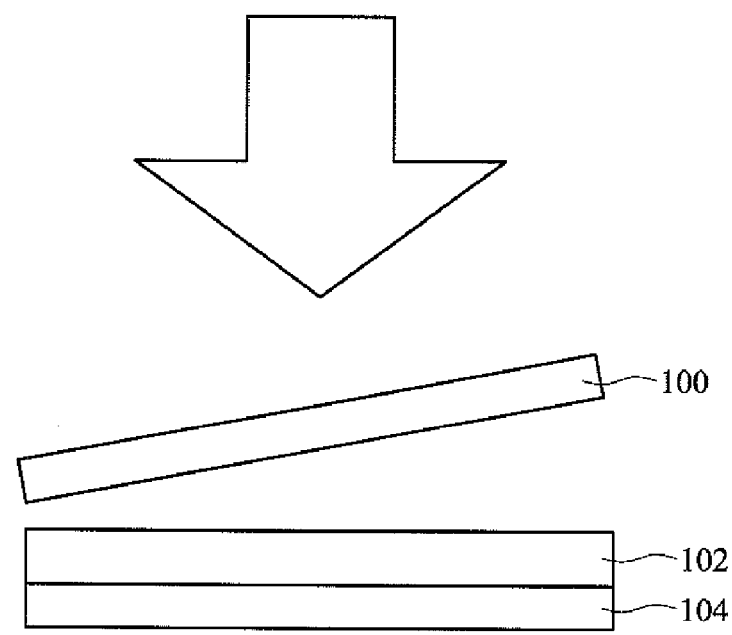
Figure 1D:
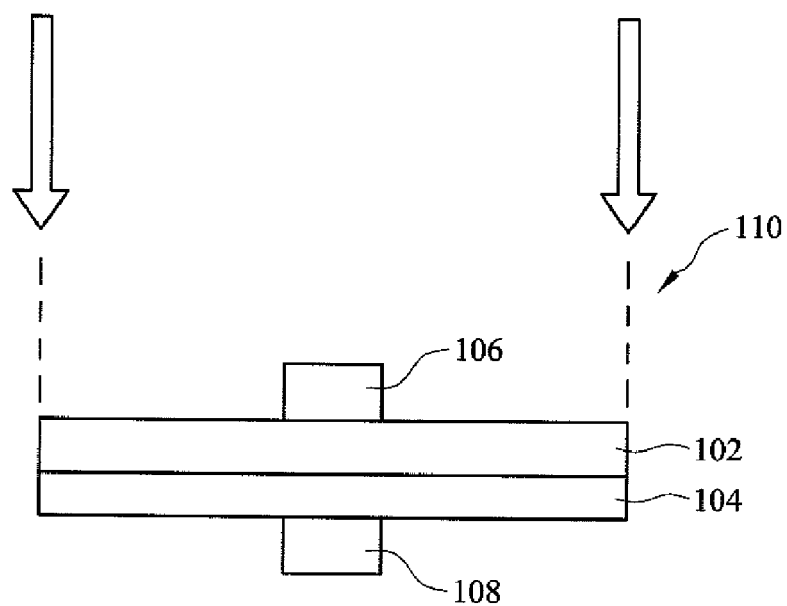
Figure 2A:
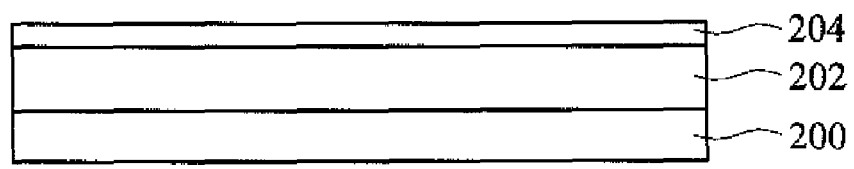
FIGS. 2a through 2e are schematic flow diagrams showing the process for manufacturing a vertical light-emitting diode in accordance with a preferred embodiment of the present invention.
Figure 2B:
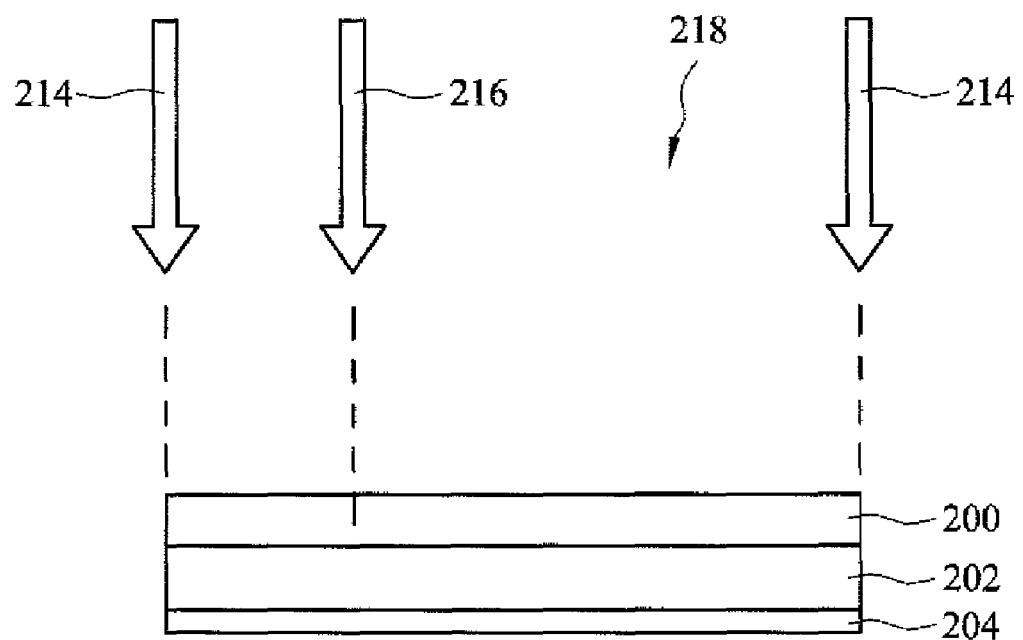
Figure 2C:
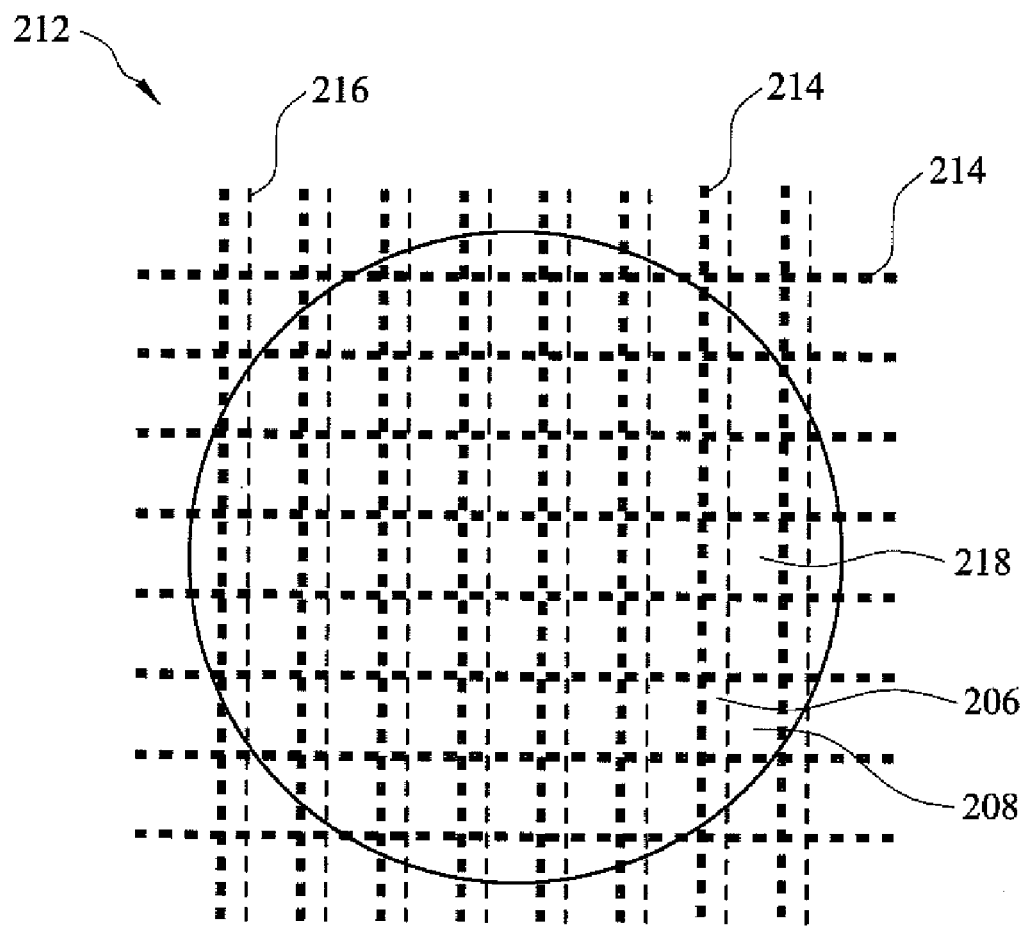

FIGS. 2a through 2e are schematic flow diagrams showing the process for manufacturing a vertical light-emitting diode in accordance with a preferred embodiment of the present invention. In the present invention, when a vertical light-emitting diode is manufactured, a sapphire substrate 200 is provided. An illuminant epitaxial structure 202 is grown on a surface of the sapphire substrate 200 by, for example, an epitaxial method. In some examples, the illuminant epitaxial structure 202 may comprise a second conductivity type semiconductor layer, an active layer and a first conductivity type semiconductor layer stacked in sequence. The light-emitting diode of the present invention may be a GaN-based light-emitting diode, and the active layer in the illuminant epitaxial structure is composed of one or more GaN-based materials. Next, a first conductivity type electrode 204 is formed on another surface of the illuminant epitaxial structure 202, which is opposite to the surface where the sapphire substrate 200 located, so as to depose the first conductivity type electrode 204 on the first conductivity type semiconductor layer of the illuminant epitaxial structure 202, such as shown in FIG. 2a. In the present embodiment, a material of the first conductivity type electrode 204 is preferably metal, and is more preferably metal of high reflectivity, which can more effectively reflect the light emitted by the illuminant epitaxial structure 202. The sapphire substrate 200, the illuminant epitaxial structure 202 and the first conductivity type electrode 204 constitute a light-emitting diode wafer 212, such as shown in FIG. 2c.

Figure 2D:
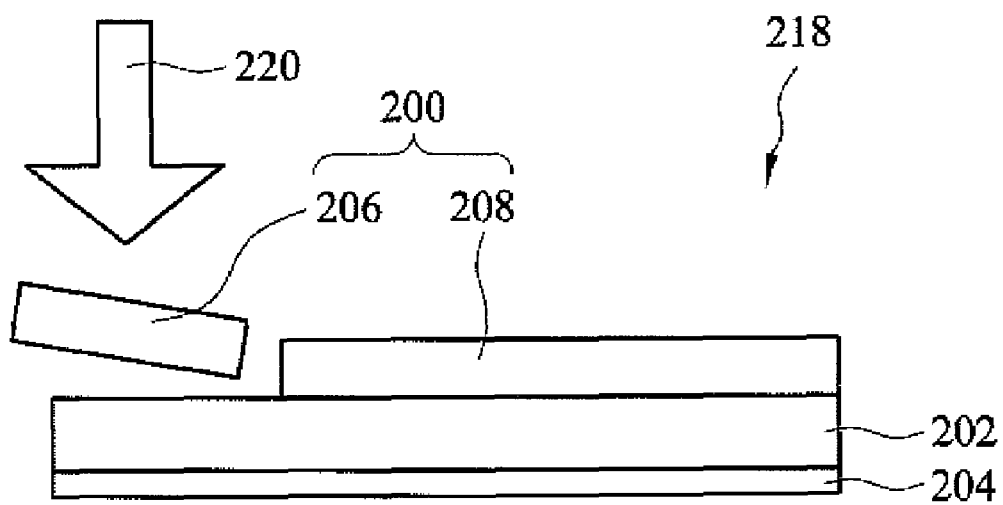

Reference is made to FIGS. 2b and 2c, wherein after the first conductivity type electrode 204 is formed, the light-emitting diode wafer 212 is flipped to make the sapphire substrate 200 be the diced surface, and a first dicing procedure 214 is performed on the light-emitting diode wafer 212. The first dicing procedure 214 is performed along the scribing lines of the light-emitting diode wafer 212 by, for example, a laser dicing technique, so as to divide the light-emitting diode wafer 212 into a plurality of light-emitting diode chips 218, such as shown in FIG. 2c. Then, a local removal procedure is performed. A second dicing procedure 216 is performed by, for example, a laser dicing technique. By the first dicing procedure 214 and the second dicing procedure 216, portions 206 desired to be removed and portions 208 desired to be kept in the sapphire substrate 200 are cut apart, such as shown in FIGS. 2b and 2c. After the first dicing procedure 214 and the second dicing procedure 216 are completed, because the portions 206 desired to be removed in the sapphire substrate 200 have been cut apart, a local ablation procedure 220 is performed by, for example, a laser ablation technique, so as to ablate the portions 206 of the sapphire substrate 200 in the light-emitting diode chips 218 from the illuminant epitaxial structure 202 and to expose the underlying surface of the illuminant epitaxial structure 202, such as shown in FIG. 2d.

It is noteworthy that in the present embodiment, although the procedure of dicing the light-emitting diode wafer along the scribing lines to form the light-emitting diode chips is performed first, and the dicing procedure of the portions desired to be removed of the sapphire substrate is performed thereafter; in the present invention, the dicing procedure of the portions desired to be removed of the sapphire substrate may be performed first, and the dicing procedure of dividing the light-emitting diode wafer into many light-emitting diode chips may be performed thereafter. Accordingly, the present invention is not limited to the present embodiment.

Because only a portion of the sapphire substrate 200, not the whole sapphire substrate 200, is removed in the present invention, the treatment time is reduced, the degradation of operation performance of the device is greatly decreased, the production yield is effectively enhanced, the quantity of output is increased, and the fabrication cost is lowered. In addition, the sapphire substrate 200 is locally removed, which can resolve the light-absorbing issue of the substrate. Moreover, because a laser technique is used, and only local portions of the sapphire substrate 200 are removed, the invention can prevent the illuminant epitaxial structure 202 from being damaged by the high temperature produced during the ablation treatment, thereby enhancing the operation reliability of the device.

Figure 2E:
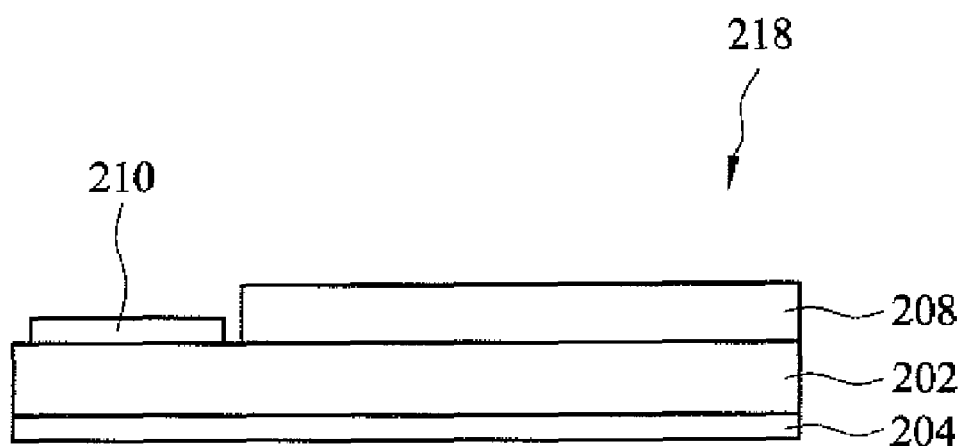

After the sapphire substrate 200 is locally removed, a second conductivity type electrode 210 is formed on the exposed surface of the illuminant epitaxial structure 202 of each light-emitting diode chip 218, i.e. the surface of the second conductivity type semiconductor layer of the illuminant epitaxial structure 202, so as to complete the fabrication of the light-emitting diode chips 218, such as shown in FIG. 2e. A material of the second conductivity type electrode 210 is preferably metal, and is more preferably metal of high reflectivity. In the present invention, the first conductivity type and the second conductivity type are opposite conductivity types. That is, when the first conductivity type is P-type, the second conductivity type is N-type; conversely, when the first conductivity type is N-type, the second conductivity type is P-type. In the light-emitting diode chip 218, the first conductivity type electrode 204 and the second conductivity type electrode 210 are respectively on the opposite surfaces of the illuminant epitaxial structure 202, and the light-emitting diode chip 218 is a vertical light-emitting diode.

One feature of the present invention is that only by locally removing the insulating sapphire substrate to expose a portion of the conductive illuminant epitaxial structure, the electrode can be deposed on the exposed surface of the illuminant epitaxial structure to form a vertical light-emitting diode structure. Therefore, with the application of the present invention, time is saved by not needing to ablate the whole substrate, and an additional substrate is not required, which eliminates the procedure of bonding the illuminant epitaxial structure to the additional substrate. Accordingly, the energy transfer produced in the ablation procedure is reduced, thereby decreasing the negative effect to the device quality, saving the fabrication cost, increasing the quantity of output and enhancing the yield. The light emitted by the illuminant epitaxial structure can be mainly extracted from the sapphire substrate, so the light-emitting diode of the present invention has an excellent light extraction effect. Additionally, the light-emitting diode of the present invention has a vertical transmission structure, so the current-spreading effect is superior, which can be applied in the light-emitting diode of large power or large current.

According to the aforementioned description, one advantage of the method for manufacturing a light-emitting diode of the present invention is that after the illuminant epitaxial structure is grown, the sapphire substrate is locally removed, so that the light-absorbing problem of the substrate is reduced, and the light can be extracted from the sapphire substrate, thereby greatly enhancing the light extraction effect of the device.

According to the aforementioned description, another advantage of the method for manufacturing a light-emitting diode of the present invention is that because only by locally removing the sapphire substrate, the additional procedure of bonding the illuminant epitaxial structure to another substrate is eliminated, the fabrication cost is effectively reduced, and the object of enhancing the process yield is obtained.

According to the aforementioned description, still another advantage of the light-emitting diode of the present invention is that because only a portion of the sapphire substrate is ablated by a laser technique, the time spent to ablate the substrate is greatly reduced, and the structure of the light-emitting diode is not damaged by high temperature or the excessive energy transfer, thereby enhancing the operation reliability of the device.

According to the aforementioned description, yet another advantage of the light-emitting diode of the present invention is that because it includes metal electrodes of high reflectivity, the light extraction rate of the device is superior.

According to the aforementioned description, another further advantage of the light-emitting diode of the present invention is that because it includes a vertical transmission structure, which has a superior current-spreading effect, it can be applied in the light-emitting diode of large power or large current and has wide applicability.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a vertical light-emitting diode, comprising:
    providing a sapphire substrate;
    forming an illuminant epitaxial structure on the sapphire substrate;
    forming a first electrode on a first surface of the illuminant epitaxial structure;
    performing a local removal step to remove only a portion of the sapphire substrate from a second surface of the illuminant epitaxial structure and to expose a portion of the second surface of the illuminant epitaxial structure, wherein the first surface is opposite to the second surface of the illuminant epitaxial structure; and
    forming a second electrode on the exposed portion of the second surface of the illuminant epitaxial structure.

2. The method for manufacturing a vertical light-emitting diode according to claim 1, wherein the vertical light-emitting diode is a GaN-based light-emitting diode.

3. The method for manufacturing a vertical light-emitting diode according to claim 1, wherein the local removal step comprises using a laser dicing technique and a laser ablation technique.

4. The method for manufacturing a vertical light-emitting diode according to claim 1, wherein the first electrode and the second electrode are metal electrodes.

5. The method for manufacturing a vertical light-emitting diode according to claim 4, wherein a material of the first electrode and the second electrode is a high-reflectivity metal.

6. A method for manufacturing a vertical light-emitting diode, comprising:
    providing a sapphire substrate, wherein the sapphire substrate is preset with a plurality of scribing lines;
    forming an illuminant epitaxial structure on the sapphire substrate;
    forming a first electrode layer on a first surface of the illuminant epitaxial structure;
    performing a first dicing step along the scribing lines to divide a light-emitting diode wafer comprising the sapphire substrate, the illuminant epitaxial structure and the first electrode layer into a plurality of light-emitting diode chips;
    performing a local removal step to remove a portion of the sapphire substrate by using a second dicing step to scribe the sapphire substrate from a second surface of the illuminant epitaxial structure and performing an ablation step to ablate the portion of the sapphire substrate from the second surface of the illuminant epitaxial structure and to expose a portion of the second surface of the illuminant epitaxial structure in each of the light-emitting diode chips, wherein the second surface and the first surface of the illuminant epitaxial structure are on opposite sides; and
    forming a second electrode layer on the exposed portion of the second surface of the illuminant epitaxial structure in each of the light-emitting diode chips.

7. The method for manufacturing a vertical light-emitting diode according to claim 6, wherein the vertical light-emitting diode chips are a plurality of GaN-based light-emitting diode chips.

8. The method for manufacturing a vertical light-emitting diode according to claim 6, wherein the first dicing step comprises a laser dicing technique.

9. The method for manufacturing a vertical light-emitting diode according to claim 6, wherein the second dicing step comprises a laser dicing technique.

10. The method for manufacturing a vertical light-emitting diode according to claim 6, wherein the ablation step comprises a laser ablation technique.

11. The method for manufacturing a vertical light-emitting diode according to claim 6, wherein the first electrode layer and the second electrode layer are metal electrode layers.

12. The method for manufacturing a vertical light-emitting diode according to claim 11, wherein a material of the type electrode layer and the second electrode layer is a high-reflectivity metal.

13. A method for manufacturing a vertical light-emitting diode, comprising:
    providing a sapphire substrate, wherein the sapphire substrate is preset with a plurality of scribing lines;
    forming an illuminant epitaxial structure on the sapphire substrate;
    performing a first dicing step along the scribing lines to divide a light-emitting diode wafer comprising the sapphire substrate and the illuminant epitaxial structure into a plurality of light-emitting diode chips;
    performing a local removal step to remove a portion of the sapphire substrate by using a second dicing step to scribe the sapphire substrate from a surface of the illuminant epitaxial structure; and
    performing an ablation step to ablate the portion of the sapphire substrate from the surface of the illuminant epitaxial structure and to expose a portion of the illuminant epitaxial structure in each of the light-emitting diode chips.

14. The method for manufacturing a vertical light-emitting diode according to claim 13, wherein the vertical light-emitting diode chips are a plurality of GaN-based light-emitting diode chips.

15. The method for manufacturing a vertical light-emitting diode according to claim 13, wherein the first dicing step comprises a laser dicing technique.

16. The method for manufacturing a vertical light-emitting diode according to claim 13, wherein the second dicing step comprises a laser dicing technique.

17. The method for manufacturing a vertical light-emitting diode according to claim 13, wherein the ablation step comprises a laser ablation technique.

\* \* \* \* \*